US006593621B2

(12) United States Patent
Tsuchiko et al.

(10) Patent No.: US 6,593,621 B2
(45) Date of Patent: Jul. 15, 2003

(54) LDMOS FIELD EFFECT TRANSISTOR WITH IMPROVED RUGGEDNESS IN NARROW CURVED AREAS

(75) Inventors: Hideaki Tsuchiko, Santa Clara, CA (US); Bruce Lee Inn, San Jose, CA (US); Marty Garnett, Los Gatos, CA (US); Phillip Fischer, Campbell, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 09/938,425

(22) Filed: Aug. 23, 2001

(65) Prior Publication Data

US 2003/0038316 A1 Feb. 27, 2003

(51) Int. Cl.[7] .......................... H01L 29/76; H01L 29/94
(52) U.S. Cl. ..................... 257/335; 257/336; 257/339; 257/340
(58) Field of Search .................. 257/335, 336, 257/334, 340

(56) References Cited

U.S. PATENT DOCUMENTS

| 4,232,327 | A |   | 11/1980 | Hsu .............................. 357/23 |
| 4,300,150 | A |   | 11/1981 | Colak ........................... 357/23 |
| 4,318,216 | A |   | 3/1982 | Hsu .............................. 29/571 |
| 5,473,180 | A | * | 12/1995 | Ludikhuize .................. 257/336 |
| 5,517,046 | A |   | 5/1996 | Hsing et al. ................. 257/336 |
| 5,633,521 | A | * | 5/1997 | Koishikawa ................. 257/336 |
| 5,635,743 | A |   | 6/1997 | Takahashi .................... 257/343 |
| 5,846,866 | A |   | 12/1998 | Huang et al. ................ 438/306 |
| 6,160,290 | A | * | 12/2000 | Pendharkar et al. ........ 257/339 |

FOREIGN PATENT DOCUMENTS

GB    2277406 A    10/1994

OTHER PUBLICATIONS

Amato, M., "Reduced Electric Field Crowding at the Fingertips of Lateral DMOS Transistors," Abstract No. 312, pp. 161–162 (1987).
Yilmaz, Hamza, "Modeling and Optimization of Lateral High Voltage IC Devices to Minimize 3–D Effects, " *High Voltage and Smart Power Devices*, pp. 290–294 (1987).

* cited by examiner

Primary Examiner—Eddie Lee
Assistant Examiner—Joseph Nguyen
(74) Attorney, Agent, or Firm—Patent Law Group LLP; Carmen C. Cook (57) ABSTRACT

A lateral DMOS transistor incorporates one or more enhancement schemes for improving the breakdown voltage characteristics and ruggedness of the transistor. In one embodiment, the drain region of the lateral DMOS transistor is separated from the body region by a first distance in the rectilinear region necessary to achieve a first breakdown voltage, and separated by a second distance in the curved region necessary to achieve at least the first breakdown voltage, the second distance being greater than the first distance. In another embodiment, the gate partially overlies the field oxide region by a third distance in the rectilinear region and by a fourth distance in the curved region, the fourth distance being greater than the third distance. The enhancement schemes optimize the breakdown voltage characteristics and ruggedness of the lateral DMOS transistor in both the rectilinear and curved regions.

18 Claims, 5 Drawing Sheets

LDMOS FIELD EFFECT TRANSISTOR WITH IMPROVED RUGGEDNESS IN NARROW CURVED AREAS

BACKGROUND OF THE INVENTION

1. Field of the Invention

The invention relates to lateral double-diffused metal-oxide-semiconductor (LDMOS) transistors and, in particular, to an LDMOS transistor with improved ruggedness at curved areas.

2. Description of the Related Art

Figure 1:
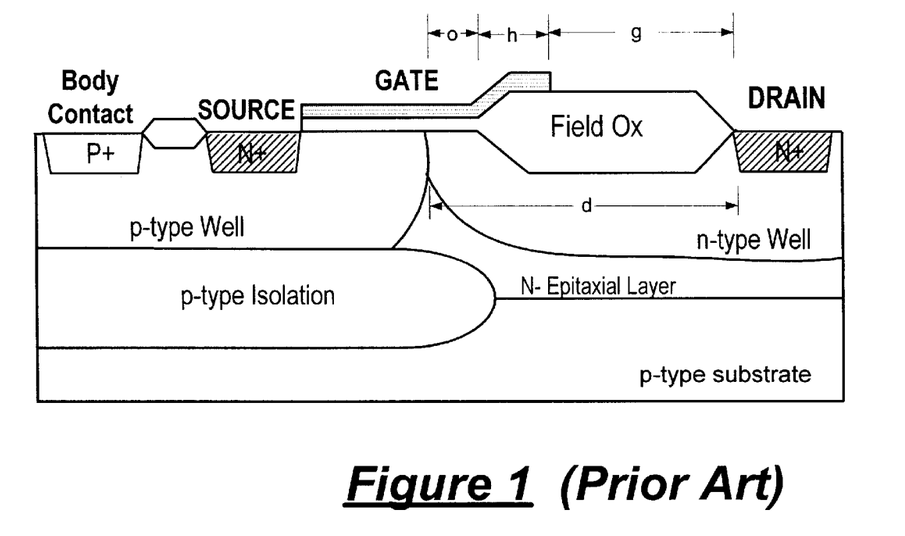
FIG. 1 is a cross-sectional view of a conventional LDMOS transistor.

Lateral double-diffused metal-oxide-semiconductor (LDMOS) transistors are commonly used in high-voltage applications because of their high breakdown voltage characteristics. FIG. 1 is a cross-sectional view of a conventional LDMOS transistor. It is well known that by increasing the length of the drift region, denoted by the distance "d", the breakdown voltage of the LDMOS transistor can be accordingly increased.

Device modelling typically involves only two-dimensional (2D) analysis of an LDMOS transistor (that is, the depth and the length of the transistor). Such 2D modelling neglects three-dimensional effects on the surface of the transistor. It is well known that the layout geometry of an LDMOS transistor can have an adverse impact on device characteristics, such as the breakdown voltage, of the transistor. Specifically, when the layout geometry of an LDMOS transistor includes curved regions such as when the transistor is shaped in a race-track or in loops, the LDMOS transistor can suffer from a low breakdown voltage at the curved regions due to electric field crowding effects. Electric field crowding effects describe the conditions where the surface electric field of an LDMOS transistor is higher at the curved regions of the transistor as compared to the parallel regions due to electric field crowding at the curved regions.

Figure 2:
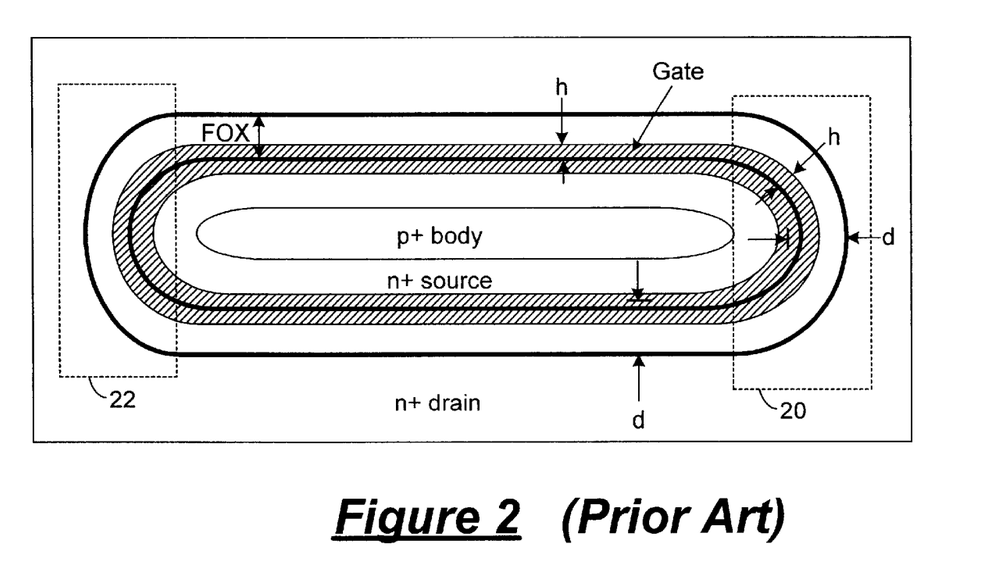
FIG. 2 illustrates a conventional race-track layout geometry of a LDMOS transistor.

FIG. 2 illustrates a conventional race-track layout geometry of a LDMOS transistor. Because of electric field crowding effects, the breakdown voltages of the curved end regions (regions 20 and 22) are lower than the breakdown voltages of the parallel or rectilinear regions. Thus, the breakdown voltage of the LDMOS transistor is limited by the breakdown voltage of the curved regions. A method for reducing the electric field crowding at the curved regions of an LDMOS transistor has been proposed where the buried layer in the LDMOS transistor is extended towards the drain of the transistor. (See, M. Amato, "Reduced Electric Field Crowding at the Fingertips of Lateral DMOS Transistors," Proceedings of the Electrochemical Society, pp. 161–162, 1987.) While this method is effective in improving the breakdown voltage in the curved regions of an LDMOS transistor to match that of the parallel regions, the method also results in an overall increase in the on-resistance ($R_{on}$) of the LDMOS transistor. A large increase in on-resistance of a transistor is undesirable, especially for high-voltage applications.

Therefore, it is desirable to optimize the breakdown voltage characteristics of an LDMOS transistor over the entire layout geometry of the transistor without severely impacting other device characteristics of the transistor.

SUMMARY OF THE INVENTION

According to the present invention, an LDMOS transistor incorporates one or more enhancement schemes for improving the breakdown voltage characteristics and ruggedness over the entire geometry of the transistor. In one embodiment, the LDMOS transistor is formed in an N-epitaxial layer with a polysilicon gate, N+ source and drain regions, p-type body region, and a field oxide region. The LDMOS transistor has a geometric shape including a rectilinear region and a curved region. The drain region is separated from the p-type body region by a first distance in the rectilinear region necessary to achieve a first breakdown voltage, and separated by a second distance in the curved region necessary to achieve at least the first breakdown voltage, where the second distance is greater than the first distance.

In another embodiment, the gate partially overlies the field oxide region by a third distance in the rectilinear region and by a fourth distance in the curved region, where the fourth distance is greater than the third distance.

In yet another embodiment, the LDMOS transistor incorporates both of the above embodiments such that the drain to body separation is extended in the curved region and the gate-over-field-oxide overlap is also extended in the curved region.

In other embodiments, the drain region of the LDMOS transistor can be formed in an N-well formed in the N-epitaxial layer.

The enhancement schemes optimize the breakdown voltage characteristics and ruggedness of the lateral DMOS transistor in both the rectilinear and curved regions.

The present invention is better understood upon consideration of the detailed description below and the accompanying drawings.

BRIEF DESCRIPTION OF THE DRAWINGS

In the present disclosure, like objects which appear in more than one figure are provided with like reference numerals.

DETAILED DESCRIPTION OF THE PREFERRED EMBODIMENTS

In accordance with the present invention a lateral double-diffused metal-oxide-semiconductor (LDMOS) transistor is provided where the breakdown voltage is optimized over the entire geometry of the transistor. In one embodiment, the LDMOS transistor of the present invention obviates the electric field crowding effects by extending the drift regions at the curved regions of the transistor. In another embodiment, the electric field in the drift region of the curved region is dispersed by extending the gate conductor overlap on the field oxide region between the gate conductor and the drain region. In this manner, the electric field at the curved regions of the LDMOS transistor can be made to be equal to or lower than that of the rectilinear regions. The breakdown voltage of the LDMOS transistor can be optimized for the entire geometry of the transistor instead of being limited by the curved regions where crowding of the electric field decreases the breakdown voltage that can be sustained. The LDMOS transistor of the present invention has usage in high voltage applications, such as those in the range of 60 to 1000 volts.

Figure 3:
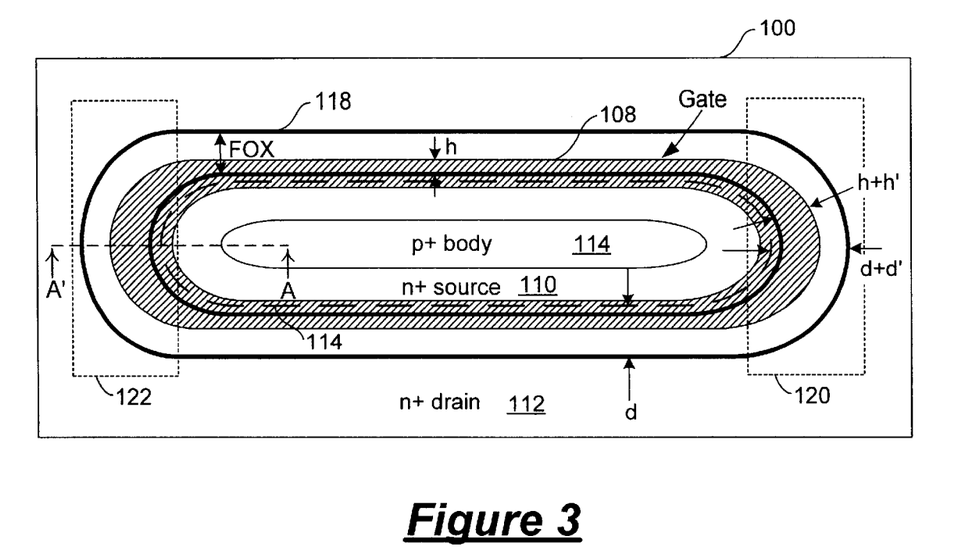
FIG. 3 is a top view of an LDMOS transistor formed in a race-track shaped geometry illustrating the various regions of the transistor according to one embodiment of the present invention.
Figure 4:
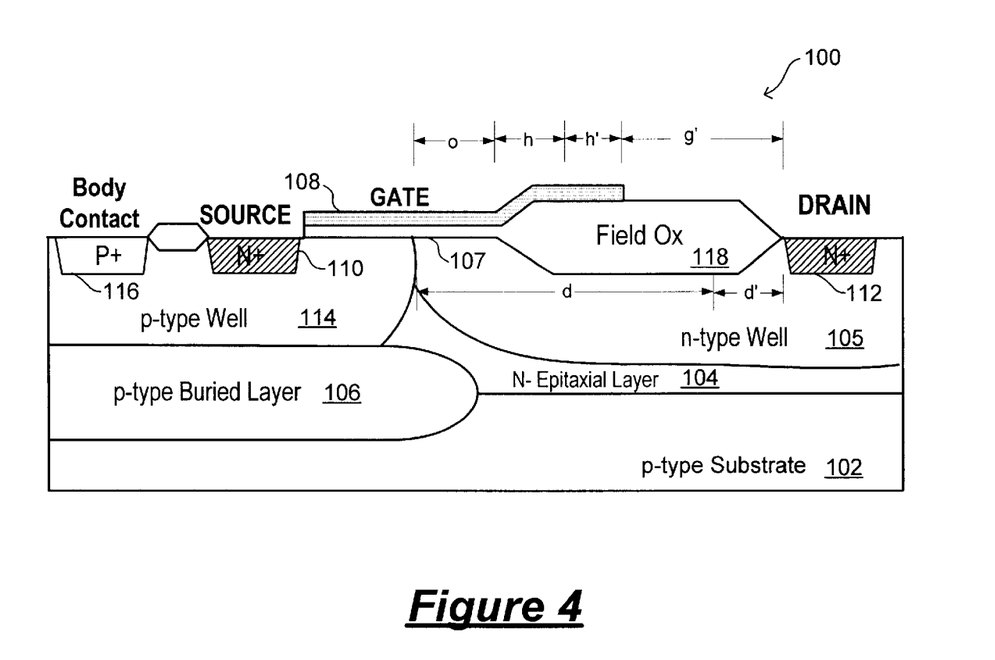
FIG. 4 is a cross-sectional view of the LDMOS transistor of FIG. 3 at the curved end of the transistor along the line A–A'.

FIG. 3 is a top view of an LDMOS transistor formed in a race-track shaped geometry illustrating the various regions of the transistor according to one embodiment of the present invention. A cross-sectional view of the LDMOS transistor at the curved end of the transistor along the line A–A' is shown in FIG. 4. In the present embodiment, LDMOS transistor 100 is built on a p-type substrate 102 having a resistivity of approximately 7 ohm-cm. An N-epitaxial layer 104 of approximately 7.5 microns thick is then grown on the surface of substrate 102 using conventional techniques. The resistivity of epitaxial layer 104 can be approximately 3 ohm-cm. Transistor 100 may include an optional p-type buried layer 106 for shaping the electric field in the channel region and the drift region of the transistor.

On the surface of N-epitaxial layer 104, an oxide layer 107 is formed to insulate a gate 108 from the substrate. The gate oxide layer is typically thermally grown and has a thickness of approximately 50 nm. Gate 108 is typically a polysilicon layer deposited and patterned using conventional techniques. Formed within N-epitaxial layer 104 also include an N+ source region 110, an N+drain region 112, a p-type well region 114 which is used as the body region of the LDMOS transistor, and an N-type well region 105. N-type well region 105 is optional and in other embodiments, LDMOS transistor 100 can be formed directly in N-epitaxial layer 104, as will be discussed in more detail below. A p+ body contact region 116 is formed for making contact to p-type well region 114.

In the present embodiment, LDMOS transistor 100 includes a field oxide region 118 extending from underneath the source side of gate 108 to drain region 112. Field oxide region 118 is included to reduce the Miller capacitance of the transistor and increase the breakdown voltage between gate 108 and drain region 112, as is understood by one skilled in the art. LDMOS transistor 100 thus formed includes a drift region extending from the edge of p-type well region 114 to drain region 112. In FIG. 4, the drift region is denoted by the distance d+d'.

When LDMOS transistor 100 is formed in a race-track shaped geometry as shown in FIG. 3 or any other geometry including curved regions, the breakdown voltage characteristics and the ruggedness of the transistor are limited by the characteristics at the curved regions because of electric field crowding effects. This is often undesirable particularly because the curved region constitutes only a small portion of the entire width of the LDMOS transistor. In accordance with the present invention, enhancement schemes for improving the breakdown voltage characteristics and the ruggedness of the LDMOS transistor at the curved end regions are provided so that the overall performance of the transistor can be enhanced.

The first enhancement scheme for improving the breakdown voltage characteristics and the ruggedness of LDMOS transistor 100 involves selectively extending the drift region of the LDMOS transistor. Referring to FIG. 3, LDMOS transistor 100 is formed with a varied length drift region where the drift region at the curved ends (regions 120 and 122) of the race-track geometry is extended in order to reduce the effect of electric field crowding in these curved regions. In this manner, the breakdown voltage characteristics of LDMOS transistor 100 can be made uniform across the entire width of the transistor and the breakdown voltage of transistor 100 is no longer limited by the curved regions inflicted with higher electric field due to electric field crowding. In FIG. 3, the drift region in the rectilinear regions of LDMOS transistor 100 has a length of d while the maximum drift region in the curved regions (regions 120 and 122) has a length of d+d', where d' is the extended length of the drift region in the curved regions. The length d is chosen to give the desired breakdown voltage of LDMOS transistor 100, and the length of d+d' is chosen to give the same desired breakdown voltage.

Referring to the cross-sectional view of FIG. 4 illustrating the transistor structure at a curved end of LDMOS transistor 100, the drift region of the transistor, denoted d+d', is the sum of the lengths g', h, h' and o, where g'+h+h' represents the length of field oxide region 118, h+h' represents the amount of gate 108 overlap of the field oxide region, and o represents the length from the edge of the p-type well region 114 to the edge of field oxide region 118. In the present embodiment, the drift region of transistor 100 is extended by extending field oxide region 118 to a length of g'+h+h', resulting in an additional field oxide length of d'. Extending the drift region of the transistor has the effect of decreasing the electric field at the gate oxide area underneath gate 108. By selectively extending the drift region only at curved regions affected by the electric field crowding effects, the breakdown voltage characteristics at the curved end regions (regions 120 and 122) of LDMOS transistor 100 can be made the same or better than the breakdown voltage at the rectilinear regions while preserving other device characteristics of the transistor. For example, while extending the drift region increases the on-resistance of the LDMOS transistor, by selectively extending the drift regions only at the curved portions of LDMOS transistor 100, the increased on-resistance is limited to the curved regions which form only a small part of the entire transistor. Therefore, LDMOS transistor 100 can attain improved performance in breakdown voltage characteristics without severely compromising other device characteristics, such as a large increase in on-resistance. If the entire length of field oxide region 118 is extended to accommodate the curved regions, the on-resistance or other device characteristics of LDMOS transistor 100 can be severely compromised.

In one embodiment, the length of field oxide region 118 is extended by at least 50% at the widest point in the curved regions. Of course, the field oxide length extension is introduced gradually from the rectilinear regions to the curved end regions to provide a smooth interface, as illustrated in FIG. 3. For example, in a 2 $\mu$m fabrication process, the length of field oxide region 118 in the rectilinear regions of LDMOS transistor 100 can be 6 $\mu$m and the length of field oxide region 118 in the curved regions of the transistor can be 9 $\mu$m at the widest point.

Another enhancement scheme for improving the breakdown voltage characteristics and ruggedness of transistor 100 involves extending the gate conductor overlap of the field oxide region. Referring to FIG. 3, in the rectilinear regions, gate 108 overlaps field oxide region 118 by a length of h, while in the curved end regions (regions 120 and 122), gate 108 overlaps field oxide region 118 by a length of h+h'. The cross-sectional view in FIG. 4 shows gate 108 overlapping gate oxide region by h+h' in the curved end regions. Extending the gate-over-field-oxide overlap by h' has the effect of spreading out the electric field under gate 108 so that the intensity of the electric field near the gate oxide region is reduced.

In one embodiment, the gate-over-field-oxide overlap is increased by at least 100% at the widest point in the curved regions of the transistor. The gate conductor extension is introduced gradually from the rectilinear regions to the curved end regions to provide a smooth interface, as illustrated in FIG. 3. For example, in a 2 μm fabrication process, the length h of the gate over field oxide overlap in the rectilinear regions of LDMOS transistor 100 can be 3 μm and the length h+h' of the gate over field oxide overlap in the curved regions of the transistor can be 6 μm at the widest point.

In the present embodiment, LDMOS transistor 100 incorporates both enhancement schemes of improving the breakdown voltage characteristics and ruggedness of the transistor described above. That is, LDMOS transistor 100 includes an extended drift region and an extended gate-over-field-oxide overlap in the curved regions. In other embodiments, it is of course possible to incorporate only one of the two schemes in an LDMOS transistor as long as the desired device characteristics can be obtained.

Figure 5:
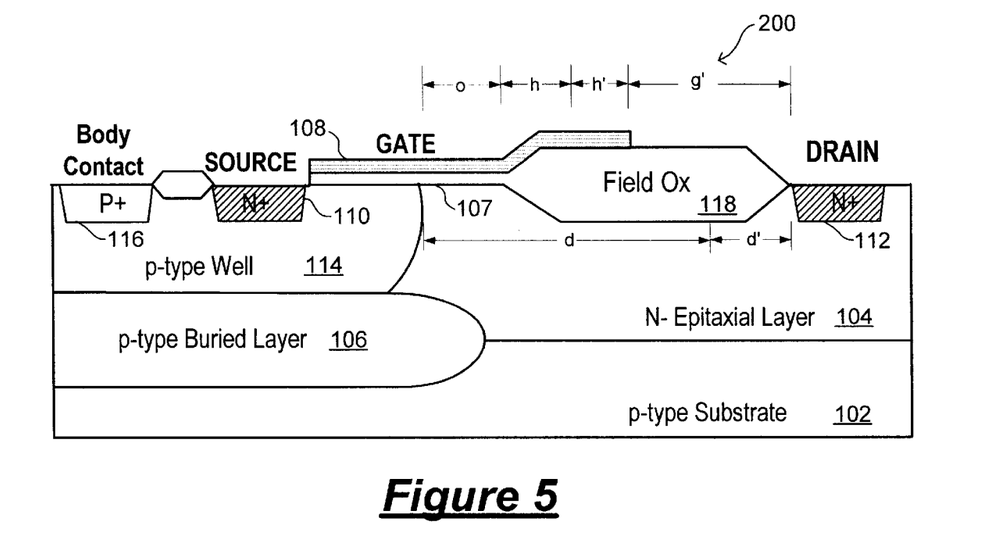
FIG. 5 is a cross-sectional view of an LDMOS transistor according to another embodiment of the present invention.

FIG. 5 is a cross-sectional view of an LDMOS transistor 200 according to another embodiment of the present invention. Like elements in FIGS. 4 and 5 are given like reference numerals to simplify the discussion. As described above, N-well 105 of LDMOS transistor 100 is optional. Thus in the embodiment shown in FIG. 5, LDMOS transistor 200 is formed in N-type epitaxial layer 104 without an N-well. The enhancement schemes described above can be applied to LDMOS transistor 200 in the same manner as LDMOS transistor 100 for effectively improving the breakdown voltage characteristics and ruggedness of LDMOS transistor 200 while not severely compromising the on-resistance of the transistor.

Figure 6:
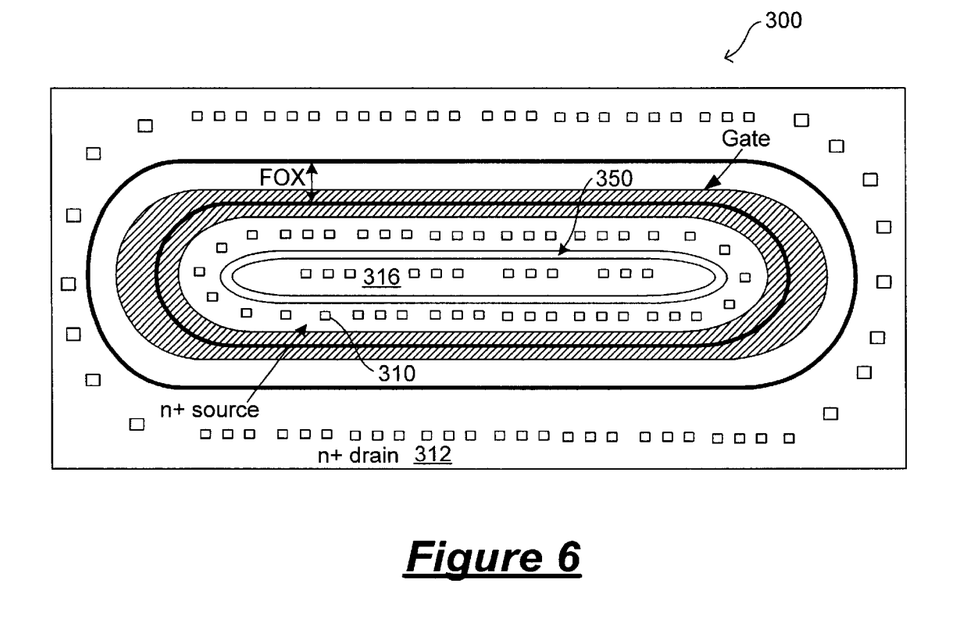
FIG. 6 illustrates an LDMOS transistor according to another embodiment of the present invention.

The top view of LDMOS transistor 100 in FIG. 3 has been simplified for ease of discussion. Of course, in actual implementation, LDMOS transistor 100 may include other device structures not shown in FIG. 3. FIG. 6 illustrates an LDMOS transistor according to another embodiment of the present invention. LDMOS transistor 300 of FIG. 6 is shown including body, source and drain contacts disposed throughout the transistor. Furthermore, LDMOS transistor 300 includes an additional field oxide region 350 between source region 310 and body contact region 316. Field oxide region 350 is included when butted contact structure is not used in the fabrication process or to provide a higher source to body voltage. In other embodiments, when butted contacts can be formed in the fabrication process, body contact region 316 and source region 310 can be contiguous.

FIGS. 3–6 illustrate embodiments of the present invention where the breakdown voltage/ruggedness enhancement schemes are applied to the conventional LDMOS transistor structure of FIG. 1. Of course, the breakdown voltage/ruggedness enhancement schemes of the present invention can be applied to a variety of LDMOS transistor structures. For example, U.S. Pat. No. 5,517,046 issued to Hsing et al. discloses improvements on the conventional LDMOS structure for enhancing the breakdown voltage while maintaining a low on-resistance. The '046 patent is incorporated herein by reference in its entirety. The breakdown voltage/ruggedness enhancement schemes of the present invention can be applied to an LDMOS transistor as described in the '046 patent where an enhanced drift region is included between the gate and the drain region.

Figure 7:
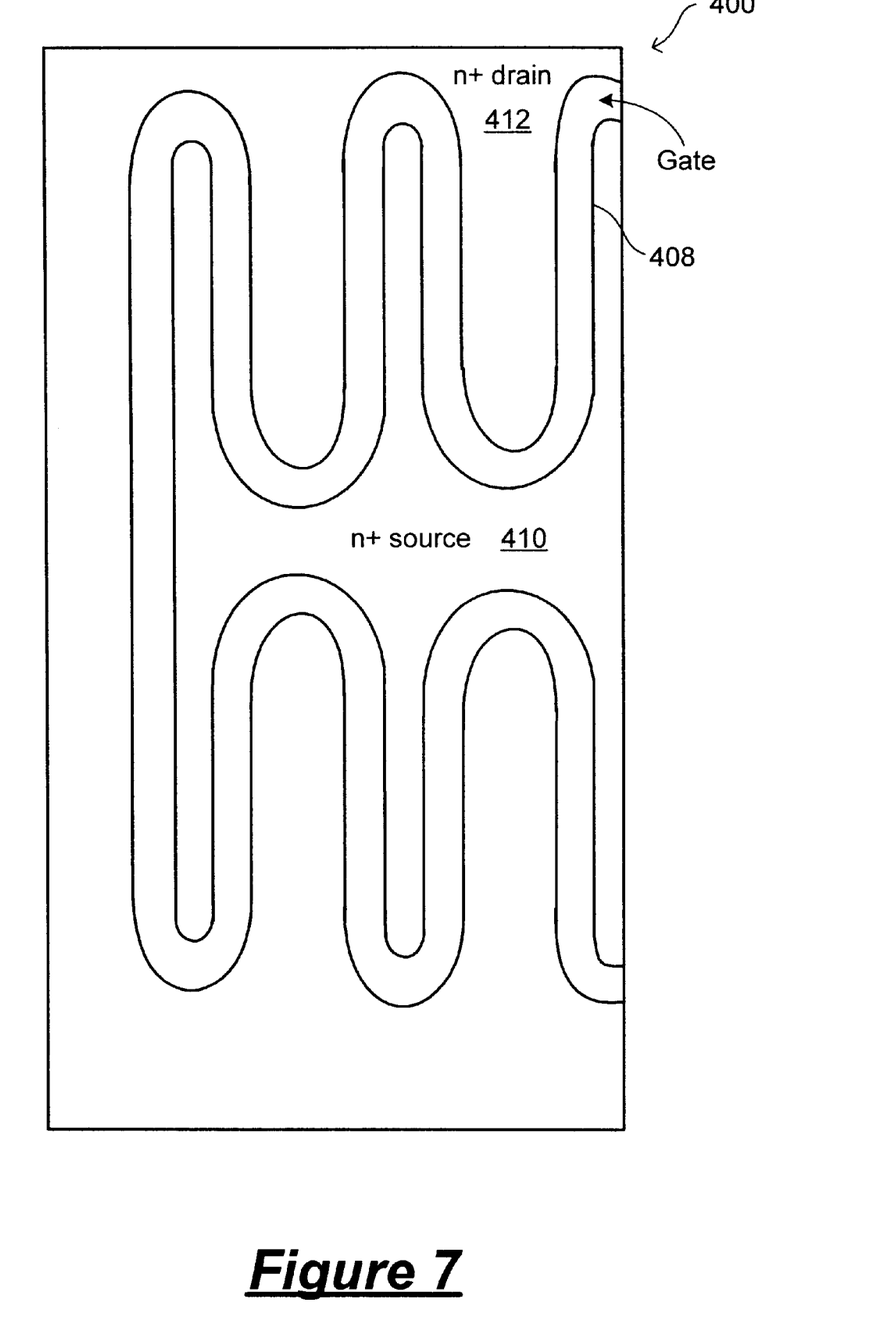
FIG. 7 illustrates a portion of an LDMOS transistor according to one embodiment of the present invention where the transistor assumes a serpentine shape.

Furthermore, while the above discussion involves a racetrack shaped layout geometry for the LDMOS transistor, the breakdown voltage/ruggedness enhancement schemes of the present invention can be applied to a variety of LDMOS transistor geometry including rectilinear and curved sections. FIG. 7 illustrates a portion of an LDMOS transistor 400 according to one embodiment of the present invention where the transistor assumes a serpentine shape. In FIG. 7, to simplify the illustration, only the shape of gate conductor 408 is shown. An n+ source region 410 is included inside gate conductor 408 and an n+ drain region 412 is included outside gate conductor 408. In one embodiment, LDMOS transistor 400 includes extended drift regions at each curved regions of the serpentine-shaped layout. In another embodiment, LDMOS transistor 400 includes extended gate-over-field-oxide overlaps at each curved regions of the serpentine-shaped layout. In yet another embodiment, LDMOS transistor 400 includes both extended drift regions and extended gate-over-field-oxide overlaps at each curved regions of the serpentine-shaped layout.

Figure 8:
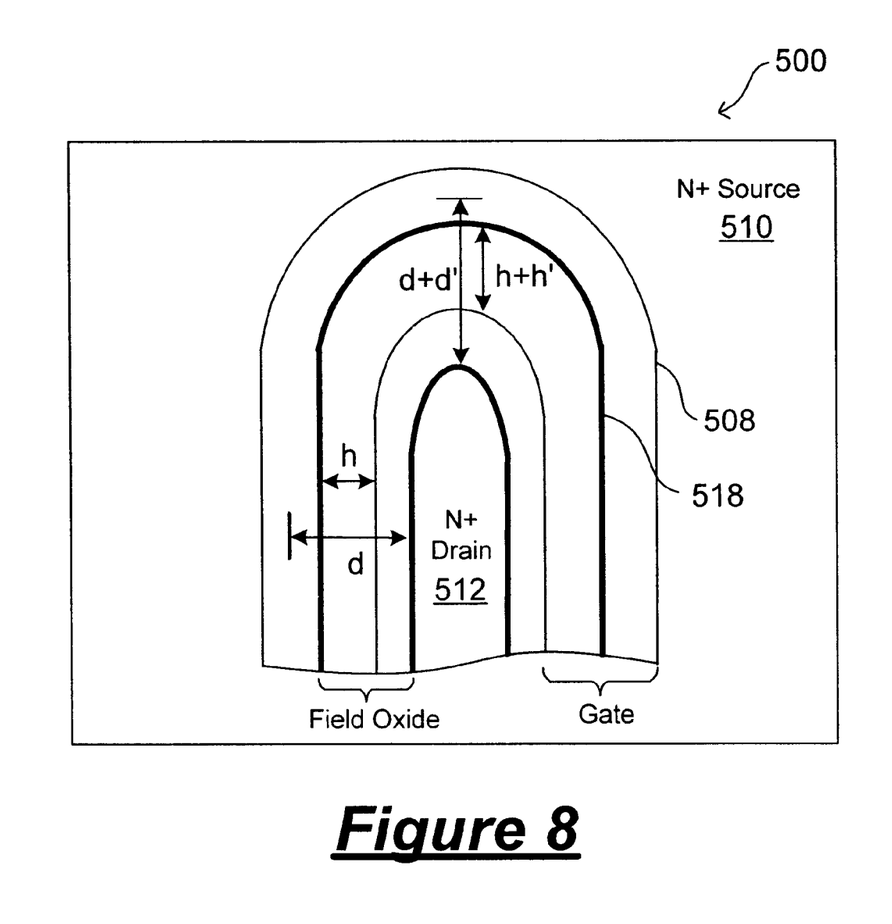
FIG. 8 is a top view of an LDMOS transistor according to another embodiment of the present invention.

In both FIGS. 3 and 7, the LDMOS transistors of the present invention are shown in a trapped-source configuration. That is, the source region is enclosed by the gate conductor. Of course, the LDMOS transistors of the present invention can also be made in a trapped-drain configuration where the drain region is enclosed by the gate. FIG. 8 is a top view of an LDMOS transistor 500 according to another embodiment of the present invention. FIG. 8 illustrates the application of the schemes of the present invention to an LDMOS transistor in a trapped-drain configuration. In FIG. 8, gate conductor 508 encloses N+ drain region 512. To implement the extended drift region scheme for improving the breakdown voltage at the curved end of transistor 500, the length of field oxide region 518 in the curved region is extended so that the drift region is increased by d' as compared to the length d of the drift region in the rectilinear region. To implement the extended gate-over-field-oxide overlap scheme for dispersing the electric field at the gate oxide regions, the gate-over-field-oxide overlap in the curved region is extended by h' as compared to the length h of the overlap in the rectilinear region.

In one embodiment, the length of field oxide region 518 is extended by at least 40% at the widest point in the curved regions. Of course, the field oxide length extension is introduced gradually from the rectilinear regions to the curved end regions to provide a smooth interface, as illustrated in FIG. 8. For example, in a 2 μm fabrication process, the length d of field oxide region 518 in the rectilinear regions of LDMOS transistor 500 is 10 μm and the length d+d' of field oxide region 518 in the curved regions of the transistor is 14 μm at the widest point.

In another embodiment, the gate-over-field-oxide overlap is increased by at least 60% at the widest point in the curved regions of the transistor. The gate conductor extension is introduced gradually from the rectilinear regions to the curved end regions to provide a smooth interface, as illustrated in FIG. 8. For example, in a 2 μm fabrication process, the length h of the gate over field oxide overlap in the rectilinear regions of LDMOS transistor 500 is 6 μm and the length h+h' of the gate over field oxide overlap in the curved regions of the transistor 10 μm at the widest point.

Although the trapped-drain configuration is more commonly used in conventional LDMOS transistors, the present invention proposes using the trapped-source configuration because it provides additional advantages not possible with the trapped-drain configuration. Specifically, in a trapped-source configuration, the drain regions of the LDMOS transistor together with the p-type up-isolation and down-isolation regions can be used to form an electrostatic discharge (ESD) protection diode. As is well known in the art, up-isolation and down-isolation regions are used for isolating the tubs (or p-wells and n-wells) in conventional BICMOS fabrication processes. When thus configured, the ESD immunity level of the LDMOS transistor can be dramatically improved.

In summary, when the breakdown voltage and ruggedness enhancement schemes of the present invention are applied to an LDMOS transistor, the breakdown voltage characteristics of the transistor are optimized such that the breakdown voltages at curved sections are made the same as or better than the breakdown voltage at the rectilinear sections. In effect, the breakdown voltage characteristics can be made uniform throughout the LDMOS transistor regardless of the layout geometry. The ESD immunity of the transistor is also improved.

Specifically, the thin gate oxide underneath the gate conductor can be protected from ESD events in both the rectilinear and curved sections. More importantly, the schemes of the present invention allows breakdown voltages to be equalized without severely and negatively impacting the on-resistance or other devices characteristics of the transistor. The advantages achieved by the breakdown voltage/ruggedness enhancement schemes of the present invention have not been realized before.

The above detailed descriptions are provided to illustrate specific embodiments of the present invention and are not intended to be limiting. Numerous modifications and variations within the scope of the present invention are possible. The present invention is defined by the appended claims.

We claim:

1. A lateral DMOS transistor structure comprising:
   a semiconductor material of a first conductivity type, said semiconductor material having a first dopant concentration and a top surface;
   a conductive gate overlying and insulated from said top surface of said semiconductor material, said conductive gate having a geometric shape including a rectilinear region and a curved region;
   a first region formed in said semiconductor material, said first region being of said first conductivity type and having a second dopant concentration to form a drain region of said DMOS transistor;
   a second region formed in said semiconductor material, said second region being of a second conductivity type and having a third dopant concentration to form a body region of said DMOS transistor, said second region having a first end underlying said conductive gate, any remaining portion of said semiconductor material underlying said conductive gate being in said first conductivity type;
   a third region formed in said semiconductor material, said third region being of said first conductivity type and having said second dopant concentration to form a source region of said DMOS transistor, said third region being located within said second region; and
   an oxide region formed in and above said top surface of said semiconductor material, said oxide region having a first end underlying said conductive gate and a second end abutting said first region;
   wherein said first region is separated from said second region by a first distance in said rectilinear region necessary to achieve a first breakdown voltage, and separated by a second distance in said curved region necessary to achieve at least said first breakdown voltage, said second distance greater than said first distance.

2. The structure of claim 1, further comprising:
   a fourth region formed in said semiconductor material and being self-aligned with said second region, said fourth region being of said first conductivity type and having a fourth dopant concentration to form a well region of said DMOS transistor, said first region being located within said fourth region.

3. The structure of claim 1, wherein said second distance is greater than said first distance by at least 40%.

4. The structure of claim 1, wherein a separation between said first region and said second region is gradually increased from said first distance in said rectilinear region to said second distance in said curved region.

5. The structure of claim 1, wherein said DMOS transistor is in a trapped-drain configuration.

6. The structure of claim 1, wherein said DMOS transistor is in a trapped-source configuration.

7. The structure of claim 1, wherein said conductive gate overlies said oxide region by a third distance in said rectilinear region and by a fourth distance in said curved region, said fourth distance greater than said third distance.

8. The structure of claim 7, wherein said fourth distance is greater than said third distance by at least 60%.

9. The structure of claim 7, wherein an overlap of said conductive gate over said oxide region is gradually increased from said third distance in said rectilinear region to said fourth distance in said curved region.

10. The structure of claim 1, further comprising:
    a fourth region formed completely within said semiconductor material, said fourth region being self-aligned with said conductive gate when forming said fourth region, said fourth region being of said first conductivity type and having a fourth dopant concentration to form an enhanced drift region of said DMOS transistor, wherein said second dopant concentration is greater than said fourth dopant concentration.

11. The structure of claim 1, wherein said first conductivity type is n-type and said second conductivity type is p-type.

12. The structure of claim 1, wherein said semiconductor material of a first conductivity type is an epitaxial layer formed on the surface of a semiconductor substrate, said semiconductor substrate having a second conductivity type.

13. A lateral DMOS transistor structure comprising:
    a semiconductor material of a first conductivity type, said semiconductor material having a first dopant concentration and a top surface;
    a conductive gate overlying and insulated from said top surface of said semiconductor material, said conductive gate having a geometry including a rectilinear region and a curved region;
    a first region formed in said semiconductor material, said first region being of said first conductivity type and having a second dopant concentration to form a drain region of said DMOS transistor;
    a second region formed in said semiconductor material, said second region being of a second conductivity type and having a third dopant concentration to form a body region of said DMOS transistor, said second region having a first end underlying said conductive gate, any remaining portion of said semiconductor material underlying said conductive gate being in said first conductivity type;

a third region formed in said semiconductor material, said third region being of said first conductivity type and having said second dopant concentration to form a source region of said DMOS transistor, said third region being located within said second region; and an oxide region formed in and above said top surface of said semiconductor material, said oxide region having a first end underlying said conductive gate and a second end contacting said first region;

wherein said first region is separated from said second region by distances in said rectilinear region and in said curved region necessary to achieve a first breakdown voltage, said conductive gate overlies said oxide region by a second distance in said rectilinear region and by a third distance in said curved region, said third distance greater than said second distance.

14. The structure of claim 13, further comprising:

a fourth region formed in said semiconductor material and being self-aligned with said second region, said fourth region being of said first conductivity type and having a fourth dopant concentration to form a well region of said DMOS transistor, said first region being located within said fourth region.

15. The structure of claim 13, wherein said third distance is greater than said second distance by at least 60%.

16. The structure of claim 13, wherein an overlap of said conductive gate over said oxide region is gradually increased from said third distance in said rectilinear region to said fourth distance in said curved region.

17. The structure of claim 13, wherein said first conductivity type is n-type and said second conductivity type is p-type.

18. The structure of claim 13, wherein said semiconductor material of a first conductivity type is an epitaxial layer formed on the surface of a semiconductor substrate, said semiconductor substrate having a second conductivity type.

* * * * *